United States Patent
Kim

(10) Patent No.: US 11,870,235 B2
(45) Date of Patent: Jan. 9, 2024

(54) SELF-POWER RELAY AND METHOD FOR PREVENTING MALFUNCTION THEREOF

(71) Applicant: LS ELECTRIC CO., LTD., Anyang-si (KR)

(72) Inventor: Ji-Ung Kim, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 699 days.

(21) Appl. No.: 17/043,126

(22) PCT Filed: Jan. 14, 2019

(86) PCT No.: PCT/KR2019/000557
§ 371 (c)(1),
(2) Date: Sep. 29, 2020

(87) PCT Pub. No.: WO2019/221362
PCT Pub. Date: Nov. 21, 2019

(65) Prior Publication Data
US 2021/0028612 A1    Jan. 28, 2021

(30) Foreign Application Priority Data
May 18, 2018  (KR) .......................... 10-2018-0057264

(51) Int. Cl.
*H02H 1/06* (2006.01)
*G01R 1/20* (2006.01)
(Continued)

(52) U.S. Cl.
CPC ................. *H02H 1/06* (2013.01); *G01R 1/20* (2013.01); *G01R 19/2513* (2013.01); *H02H 3/063* (2013.01)

(58) Field of Classification Search
CPC .......... H02H 1/06; H02H 3/063; H02H 3/207; H02H 3/24; H02H 5/12; G01R 1/20; G01R 19/2513; G01R 19/2509
(Continued)

(56) References Cited

U.S. PATENT DOCUMENTS

| 4,335,437 A | 6/1982 | Wilson et al. |
| 6,018,700 A | 1/2000 | Edel |

(Continued)

FOREIGN PATENT DOCUMENTS

| CN | 101442200 A | 5/2009 |
| CN | 102751779 A | 10/2012 |

(Continued)

OTHER PUBLICATIONS

International Search Report for related International Application No. PCT/KR2019/000557; report dated Nov. 21, 2019; (5 pages).

(Continued)

*Primary Examiner* — Michael J Brown
(74) *Attorney, Agent, or Firm* — K&L Gates LLP

(57) ABSTRACT

Disclosed are a self-power relay and a method for preventing a malfunction thereof. The self-power relay comprises: a self-power generation unit for autonomously generating a driving power by performing conversion into a preconfigured driving power level by using, as a source power, a system power of a transmission/distribution line or power system; and a relay operation unit, for measuring the amount of a system power of a transmission/distribution line or power system, blocking a system power transmitted to a load when a failure occurs, and monitoring a change in a source power of the self-power generation unit in real time, so as to stop a relay operation of the self-power generation unit and a relay operation of the relay operation unit itself when abnormality occurs, wherein a malfunction can be prevented (Continued)

by checking an unstable state of a source current and voltage for generation of a self driving power.

12 Claims, 4 Drawing Sheets

(51) Int. Cl.
*G01R 19/25* (2006.01)
*H02H 3/06* (2006.01)
*H02H 5/12* (2006.01)
*H02H 3/24* (2006.01)

(58) Field of Classification Search
USPC .................... 700/21; 713/300, 320, 330, 340
See application file for complete search history.

(56) References Cited

U.S. PATENT DOCUMENTS

| | | | |
|---|---|---|---|
| 6,262,872 | B1 | 7/2001 | Messerli et al. |
| 6,400,543 | B2 | 6/2002 | Messerli et al. |
| 9,583,942 | B2 | 2/2017 | Czarnecki |
| 2001/0033470 | A1* | 10/2001 | Messerli .................. H02H 3/44 361/93.2 |
| 2005/0094338 | A1* | 5/2005 | Minteer .................. H02H 1/06 361/71 |
| 2012/0271570 | A1 | 10/2012 | Paik et al. |
| 2015/0048767 | A1 | 2/2015 | Takezawa |

FOREIGN PATENT DOCUMENTS

| | | | |
|---|---|---|---|
| CN | 102855729 | A | 1/2013 |
| CN | 102955432 | A | 3/2013 |
| CN | 104701970 | A | 6/2015 |
| CN | 105375435 | A | 3/2016 |
| JP | S56150919 | A | 11/1981 |
| JP | 2001016761 | A | 1/2001 |
| JP | 2001359297 | A | 12/2001 |
| JP | 2013169059 | A | 8/2013 |
| JP | 2013243827 | A | 12/2013 |
| KR | 20040037811 | A | 5/2004 |
| KR | 20090120757 | A | 11/2009 |
| KR | 1020110101478 | A | 9/2011 |
| TW | M522458 | U | 5/2016 |

OTHER PUBLICATIONS

Written Opinion for related International Application No. PCT/KR2019/000557; report dated Nov. 21, 2019; (7 pages).
Japanese Office Action for related Japanese Application No. 2020-543861; action dated Oct. 1, 2021; (3 pages).
Extended European Search Report for related European Application No. 19804584.1; action dated Jun. 15, 2021; (8 pages).
Chinese Office Action for related Chinese Application No. 201980016709.1; action dated Feb. 7, 2022; (8 pages).
Shanshan; "Design of Self-powered Overcurrent Relay Based on Single Chip Microcomputer"; Industrial & Science Tribume; Nov. 19, 2012; (3 pages).
Notice of Allowance for related Chinese Application No. 201980016709.1; action dated Jul. 6, 2022; (7 pages).

\* cited by examiner

[FIG. 1]
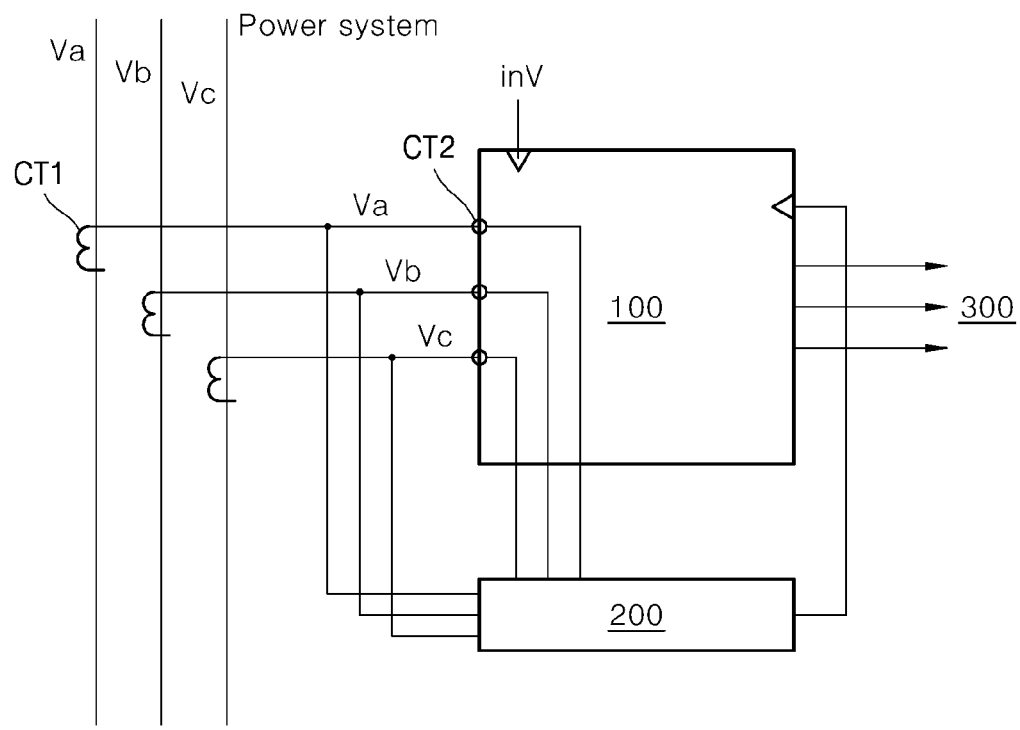

[FIG. 2]
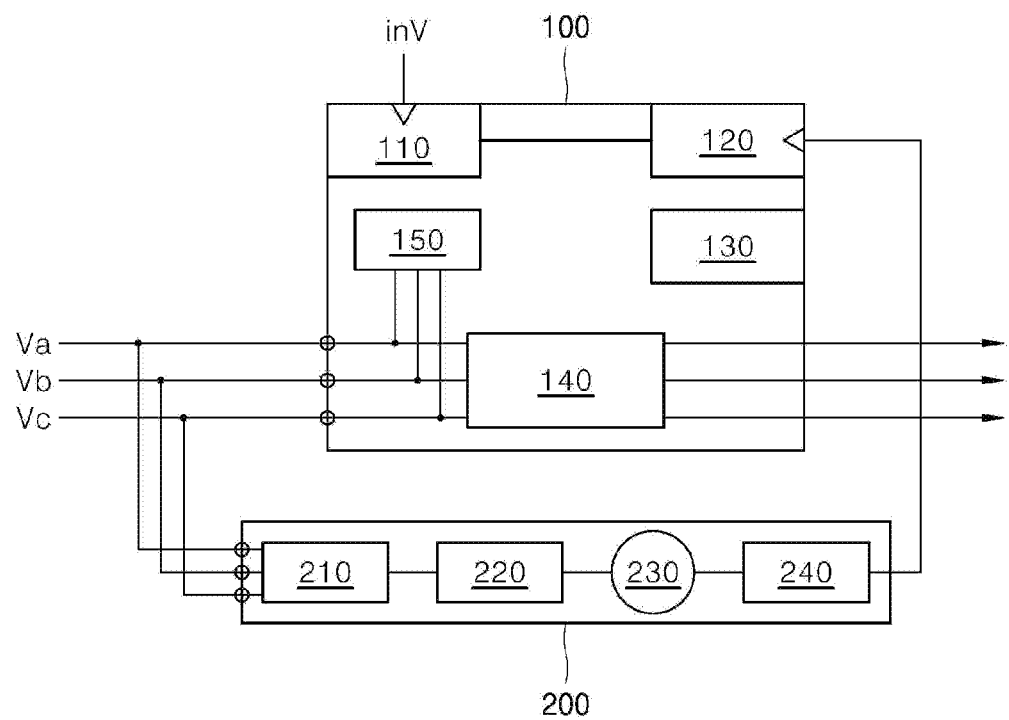
[FIG. 3]
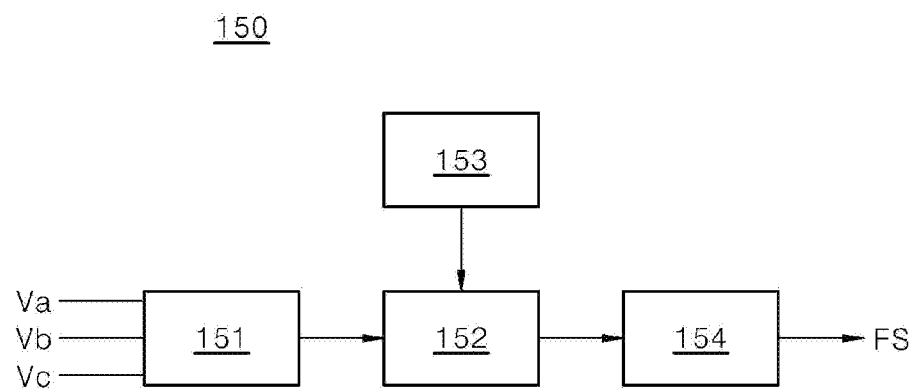

[FIG. 4]
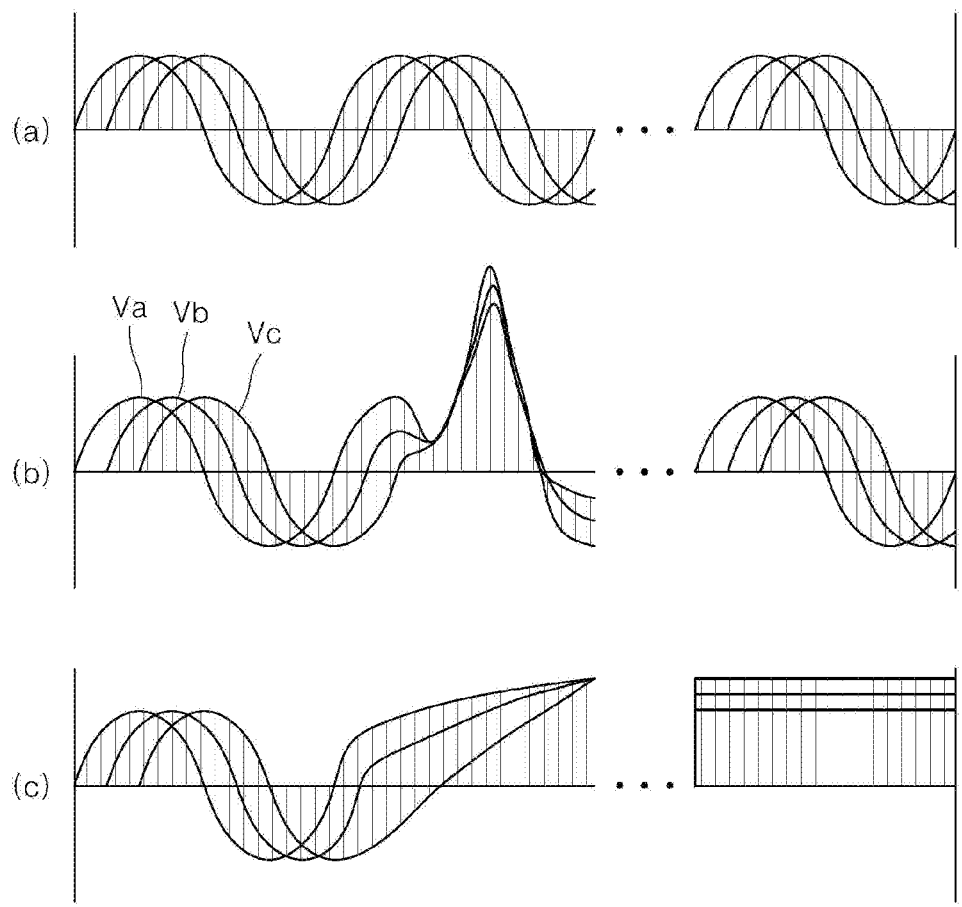

[FIG. 5]
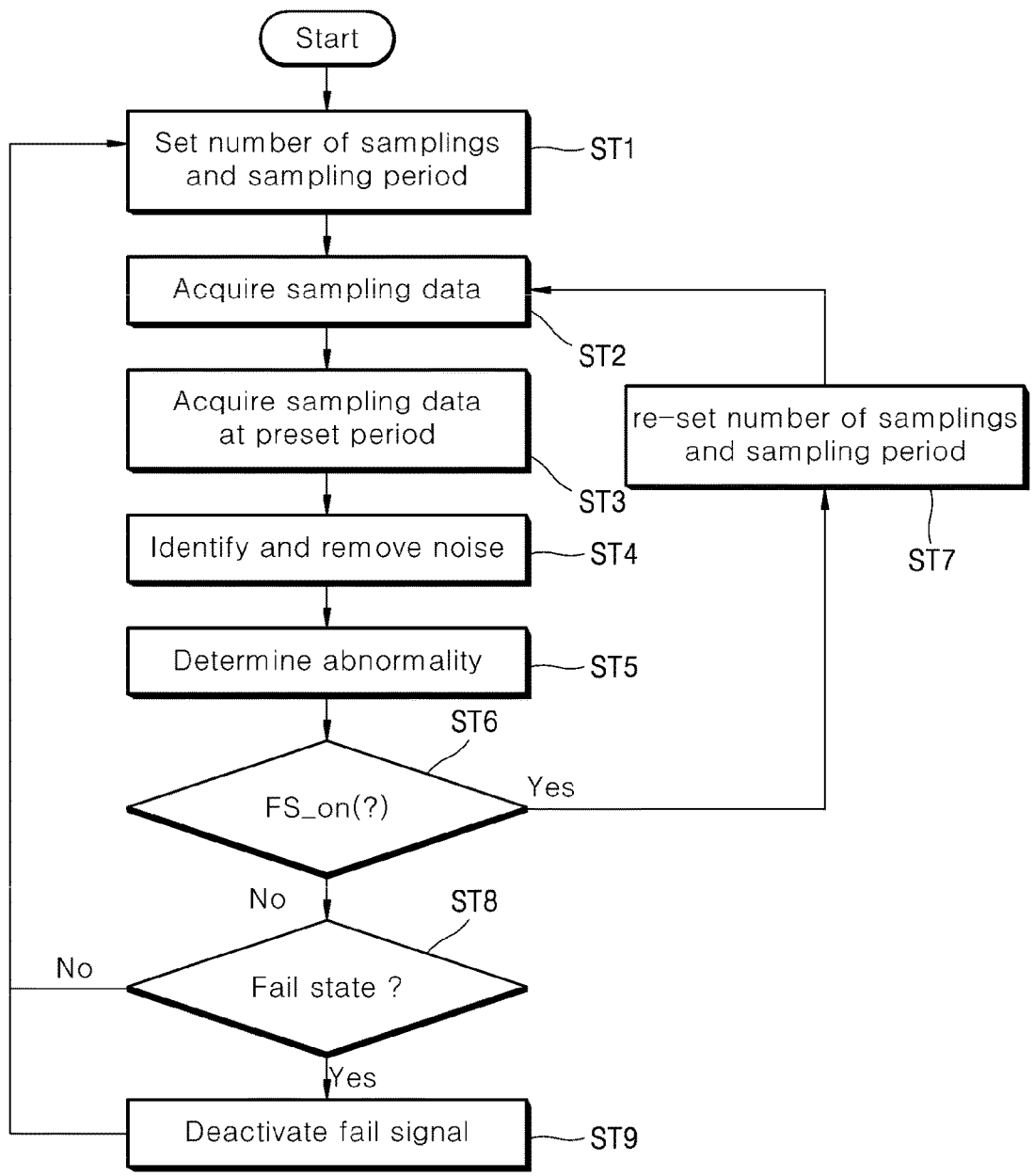

SELF-POWER RELAY AND METHOD FOR PREVENTING MALFUNCTION THEREOF

CROSS-REFERENCE TO RELATED APPLICATIONS

The present application is a National Stage of International Application No. PCT/KR2019/000557, filed on Jan. 14, 2019, which claims the benefit of earlier filing date and right of priority to Korean Application No. 10-2018-0057264 filed on May 18, 2018, the contents of which are all hereby incorporated by reference herein in their entirety.

FIELD

The present disclosure relates to a self power relay and a method for preventing malfunction thereof, in which power of a power transmission and distribution line or a power system is used as driving power of the relay when the relay performs relaying operation, and an instability state of source current and voltage used for generating the driving power is identified to prevent malfunction of the relay.

BACKGROUND

When failure occurs in a power transmission and distribution line, a power system, specific power facilities, overvoltage, undervoltage, overcurrent, frequency fluctuations, etc. occur to interfere with power supply and adversely affect the facilities. Accordingly, a failure section must be quickly separated from the power facilities to minimize the adverse effects of the failure.

To this end, devices to detect presence or absence of failure in real time, and to operate the circuit breaker quickly when the failure occurs may be disposed at the power transmission and distribution line, the power systems, etc. The devices to detect power of the power transmission and distribution line or the power system and cut off the power therein in an event of the failure include a digital protection relay, a power management unit, a power meter, etc.

The digital protection relay, the power management unit, the power meter, etc. detect analog voltage of the power transmission and distribution line or the power system using a current transformer and a voltage transformer. An analog-digital converter thereof converts the analog detected voltage to a digital value. An intelligent electronic device thereof diagnoses the failure in the power transmission and distribution lines or the power system.

A conventional digital protection relay, etc. receives rated power separately from an outside and uses the rated power as driving power of the relay.

Specifically, when the rated power of 220V/110V is separately input thereto from the outside, the conventional digital protection relay converts the rated power into 12V/5V and uses the converted power as the driving power of the relay. In this connection, in order to minimize effect of overvoltage or overcurrent of the rated power, the conventional digital protection relay compares a voltage or current amount of the driving power converted to 12V/5V with a preset reference voltage or current amount and then determines presence or absence of abnormality based on the comparison result. When the abnormality occurs, the relay generates a fail signal to stop all of operations thereof.

However, the conventional digital protection relays, etc. separately receives the rated power from the outside. Thus, each relay needs to be separately connected to the rated power. The relay may not be installed in a place where it was difficult for the relay to connect to the rated power.

Accordingly, in recent years, a scheme has been proposed in which system power transmitted to the power transmission and distribution line or the power system may be converted into the driving power of the relay which in turn may be used. However, the scheme may not be stably applied because the scheme is greatly affected by instability of the system power. Further, when the system power becomes unstable such that power supply sufficient for stable operation of the relay is not achieved, on/off operation of the relay is repeated. Thus, stability of the relay is inevitably deteriorated.

SUMMARY

The present disclosure is intended to solve the above problems. Accordingly, a purpose of the present disclosure is to provide a self power relay and a method for preventing malfunction thereof, in which power of a power transmission and distribution line or a power system is used as driving power of the relay when the relay performs relaying operation, and an instability state of source current and voltage used for generating the driving power of the relay is identified to prevent malfunction of the relay.

One aspect of the present disclosure provides a self power relay comprising: a self power generator for converting a system power as a source power to a driving power having a preset driving power level to generate the driving power of the relay; and a relay unit configured to: measure a power amount of the system power in real time while operating using the driving power; and in an event of failure of the system power, prevent the system power from being transmitted to a load and stop a relaying operation thereof and an operation of the self power generator while operating using an external rated power.

In one embodiment of the relay, the relay unit is configured to: sample current change in each of three phases system powers used as the source power for the self power generator at a preset period; calculate differences between sampling values of three phases system currents obtained via a predefined number of samplings and monitor change in each of the three phases system currents in real time, based on the calculated differences; and upon determination based on a plurality of predefined abnormality occurrence conditions that abnormality occurs in the three phases system currents, generate a fail signal to stop the relaying operation thereof and the operation of the self power generator.

In one embodiment of the relay, the relay unit is configured to: after the relaying operation stops due to the fail signal generation, sample the three phases system currents under a sampling condition changed due to the stop of the relaying operation; calculate differences between sampling values of the three phases system currents as sampled under the changed sampling condition and monitor change in each of the three phases system currents in real time, based on the calculated differences; and when the plurality of abnormality occurrence conditions are not met, normally activate the relaying operation thereof and the operation of the self power generator operation.

In one embodiment of the relay, the sampling condition changed due to the stop of the relaying operation is configured to have a sampling period larger than a sample period in a sample condition for determining presence or absence of the abnormality of the three phases system currents, and to have a number of samplings per a sampling period larger than a number of samplings per a sampling period in the sample condition for determining presence or absence of the abnormality.

In one embodiment of the relay, the plurality of abnormality occurrence conditions include at least one of: a condition in which the sampling values of the three phases system currents are maintained at the same polarity sign for a preset duration or period; a condition where the sampling values of the three phases system currents vary at the same slope for a preset duration or period; a condition where the sampling values of the three phases system currents increase or decrease at the same rate for a preset duration or period; or a condition where the sampling values of the three phases system currents are kept at the same value for a preset duration or period.

In one embodiment of the relay, the self power generator includes: a source power receiver for receiving three phases system powers of the power transmission and distribution line or the power system as the source power; a rectifying switching circuit for rectifying three phases system voltages and currents of the three phases system powers; a voltage converter for converting the rectified three phases system voltages to three phases system voltages have having a preset constant voltage level; and a direct current (DC) converter for converting the three phases system voltages having the preset constant voltage level to a DC voltage to generate the driving power as the DC voltage and supplying the driving voltage to the relay unit.

In one embodiment of the relay, the relay unit includes: a circuit breaker to cut off the system power to be transmitted to a load when a failure of the power transmission and distribution line or the power system occurs; an abnormality sensing unit configured to monitor in real time three phases system powers used as the source power of the self power generator and to generate a fail signal when abnormality occurs in the three phases system powers; a relay controller configured to: measure a system power amount of the power transmission and distribution line or the power system and control a cut-off operation of the circuit breaker when a failure occurs in the power transmission and distribution line or the power system; and stop the relaying operation of the relay unit and the operation of the self power generator when the fail signal is issued; and a self power unit for changing a voltage level of the driving power input from the self power generator to a preset level and supply the driving power having the preset level to the abnormality sensing unit and the relay controller.

In one embodiment of the relay, the abnormality sensing unit includes: a detector for detecting three phases system currents and voltage used as the source power using at least one of a current transformer or a voltage transformer; a monitoring unit configured to: sample change in a current of each of the three phases system powers at a preset period; and calculate differences between sampling values of three phases system currents of the three phases system powers obtained via a predefined number of samplings and monitor changes in the three phases system currents in real time, based on the calculated differences; condition storage for storing therein a plurality of predefined abnormality occurrence conditions, and for supporting the monitoring unit to monitor the differences between the sampling values of the three phases system currents under the abnormality occurrence conditions; and a fail generation unit for generating a fail signal and sending the fail signal to the relay controller and the self power generator when the monitoring unit determines that abnormality occurs in the three phases system currents.

One aspect of the present disclosure provides a method for preventing malfunction of a self power relay, the method comprising: converting, by a self power generator, a system power as a source power to a driving power having a preset driving power level to generate the driving power of the relay; measuring a power amount of the system power in real time while operating using the driving power; preventing the system power from being transmitted to a load in an event of failure of the system power; monitoring change in the source power for the self power generator in real time; and stopping an operation of the self power generator and a relaying operation of the relay when abnormality occurs in the source power.

In one embodiment of the method, monitoring the change in the source power and stopping the operation of the self power generator and the relaying operation of the relay include: sampling current change in each of three phases system powers used as the source power for the self power generator at a preset period; calculating differences between sampling values of three phases system currents obtained via a predefined number of samplings and monitoring change in each of the three phases system currents in real time, based on the calculated differences; and upon determination based on a plurality of predefined abnormality occurrence conditions that abnormality occurs in the three phases system currents, generating a fail signal to stop the relaying operation of the relay and the operation of the self power generator.

In one embodiment of the method, monitoring the change in the source power and stopping the operation of the self power generator and the relaying operation of the relay include: after the relaying operation stops due to the fail signal generation, sampling the three phases system currents under a sampling condition changed due to the stop of the relaying operation; calculating differences between sampling values of the three phases system currents as sampled under the changed sampling condition and monitoring change in each of the three phases system currents in real time, based on the calculated differences; and when the plurality of abnormality occurrence conditions are not met, normally activating the relaying operation thereof and the operation of the self power generator operation.

In one embodiment of the method, converting the system power to the driving power having the preset driving power level to generate the driving power of the relay includes: receiving three phases system powers of the power transmission and distribution line or the power system as the source power; rectifying three phases system voltages and currents of the three phases system powers; converting the rectified three phases system voltages to three phases system voltages have having a preset constant voltage level; and converting the three phases system voltages having the preset constant voltage level to a DC voltage to generate the driving power as the DC voltage and supplying the driving voltage to a relay unit.

In one embodiment of the method, measuring the power amount of the system power and preventing the system power from being transmitted to the load include: measuring a system power amount of the power transmission and distribution line or the power system and controlling a cut-off operation of a circuit breaker when a failure occurs in the power transmission and distribution line or the power system; stopping the relaying operation of the relay unit and the operation of the self power generator when a fail signal is issued; and changing a voltage level of the driving power input from the self power generator to a preset level and supply the driving power having the preset level to an abnormality sensing unit and a relay controller.

In one embodiment of the method, monitoring the change in the source power and stopping the operation of the self power generator and the relaying operation of the relay include: detecting three phases system currents and voltage used as the source power using at least one of a current transformer or a voltage transformer; sampling change in a current of each of the three phases system powers at a preset period; calculating differences between sampling values of three phases system currents of the three phases system powers obtained via a predefined number of samplings and monitoring changes in the three phases system currents in real time, based on the calculated differences; storing a plurality of predefined abnormality occurrence conditions, and supporting a monitoring unit to monitor the differences between the sampling values of the three phases system currents under the abnormality occurrence conditions; and generating a fail signal and sending the fail signal to the relay controller and the self power generator when the monitoring unit determines that abnormality occurs in the three phases system currents.

In the self power relay and the method for preventing malfunction thereof according to the present disclosure having various technical features as described above, the power of the power transmission and distribution line or the power system power may be used as the self-driving power of the relay when performing the relaying operation. Thus, presence or absence of abnormality in the power system may be identified by monitoring in real time a state in which the source current and voltage used for generating the driving power of the relay become unstable.

Thus, when overvoltage or overcurrent occurs in the system power used as the source power, or sufficient power amount is not supplied to the relay in generating the driving power of the relay, the relay may detect this situation in real time, thereby to prevent the malfunction of the relay. In particular, according to the present disclosure, when monitoring the system power used as the source power, a software algorithm may be used to identify change in the system power amount, thereby minimizing effect of noise or erroneous samples.

Further, the change in the current amount of the system power used as the source power may be sampled at a preset period. Then, the sampled change may be analyzed based on various abnormality occurrence conditions, thereby to identify presence or absence of the abnormality. Thus, abnormality detection efficiency and stability of the relay may be further improved.

BRIEF DESCRIPTION OF THE DRAWINGS

FIG. 1 is a block diagram specifically showing a self power relay according to an embodiment of the present disclosure.

FIG. 2 is a block diagram specifically showing a relay unit and a self power generator shown in FIG. 1.

FIG. 3 is a block diagram specifically showing an abnormality sensing unit shown in FIG. 2.

FIG. 4 is waveform diagrams showing signals corresponding to sampled system power changes as detected by the abnormality sensing unit of FIG. 3.

FIG. 5 is a flowchart for sequentially describing a method for operating a self power relay according to an embodiment of the present disclosure.

DETAILED DESCRIPTION

The above-described purposes, features and advantages will be described in detail below with reference to the accompanying drawings. Accordingly, a person with ordinary skill in a technical field to which the present disclosure belongs may easily implement an technical idea of the present disclosure. In describing the present disclosure, when it is determined that a specific description of a known element related to the present disclosure may unnecessarily obscure a gist of the present disclosure, detailed descriptions thereof may be omitted. Hereinafter, preferred embodiments of the present disclosure will be described in detail with reference to the accompanying drawings. In the drawings, the same reference numerals are used to indicate the same or similar components.

Hereinafter, a self power relay and a method for preventing malfunction thereof according to the present disclosure will be described.

FIG. 1 is a block diagram specifically showing a self power relay according to an embodiment of the present disclosure.

The self power relay shown in FIG. 1 includes a self power generator 200 and a relay unit 100. In the drawing, a configuration in which the self power generator 200 and the relay unit 100 are separate components is illustrated. However, the self power generator 200 may be integral with in the relay unit 100.

The self power generator 200 may use system power of a power transmission and distribution line or a system power using a source power and convert the system power to power having a preset driving power level to generate driving power of the relay. The generated driving power is transmitted in real time therefrom to the relay unit 100.

When the system power of the power transmission and distribution line or the power system becomes unstable, the driving power as generated by the self power generator 200 using the system power as the source power is also unstable. In other words, when the system power becomes unstable and thus sufficient power supply for stable operation of the relay unit 100 is not achieved, the relay unit 100 continuously repeats on/off operations. Thus, stability of the relay is inevitably deteriorated. Accordingly, it is desirable to monitor change in the source power input to the self power generator 200 in real time and stop an relay operation of the relay unit 100 when it is determined that the source power becomes unstable.

Thus, the relay unit 100 monitors the change in the source power of the self power generator 200 in real time and stop the power generation operation of the self power generator 200 and the relaying operation thereof when the abnormality occurs.

The relay unit 100 is driven using the driving power generated from the self power generator 200. The relay unit 100 may measure a system power amount of the power transmission and distribution line or the power system in real time and may cut off the system power to be transmitted to a load 300 when the system power failure occurs. In addition, when the system power failure occurs, the relay unit 100 may cut off the system power to be transmitted to the load and stop the generation operation of the self power generator 200 and the relaying operation thereof while the relay unit 100 operates using external rated power.

The relay unit 100 performs an operation to cut off the system power to be transmitted to the load 300 based on the result of the measurement of the system power amount of the power transmission and distribution line or the power system. Further, the relay unit 100 monitors the change in the source power of the self power generator 200 in real time, and stops the generation operation of the self power generator 200 and the relaying operation thereof when the system power abnormality occurs.

Specifically, the relay unit 100 samples current changes of three phases system powers Va, Vb, and Vc used as the source power of the self power generator 200 at a preset period. The relay unit 100 obtains differences between sampling values of three phases system currents obtained via the predefined number of samplings and monitor the change in the three phases system currents in real time, based on the obtained differences. In this connection, the relay unit 100 determines in real time presence or absence of abnormality of the three phases system currents based on a plurality of abnormality occurrence conditions predefined by an operator.

When the abnormality occurrence of the three phases system currents is detected, the relay unit 100 generates a fail signal to stop the relaying operation thereof and the generation operation of the self power generator 200.

The relay unit 100 stops the relaying operation thereof and the generation operation of the self power generator 200 upon the detection of the occurrence of abnormality of the three phases system currents. Then, when the three phases system currents are stable, the relay unit 100 monitors the three phases system currents in real time so that the relaying operation thereof and the power generation operation of the self power generator 200 may be performed again. In an event of the abnormality occurrence of the three phases system currents, the relay unit 100 operates using the rated power inV from an outside.

After stopping the relaying operation thereof in response to the occurrence of the fail signal, the relay unit 100 samples the three phases system currents under a different sampling condition due to the relaying operation stop. It is desirable that a sampling condition for reactivating the relaying operation is stricter than a sampling condition for abnormality occurrence determination.

In this way, the relay unit 100 may obtain differences between the sampling values of each of the three phases system currents as sampled under the stricter sampling condition and thus monitors the changes in the three phases system currents in real time based on the obtained differences. In addition, when the plurality of predefined abnormality occurrence conditions are not met, the relay unit 100 may normally activate the relaying operation thereof and the power generation operation of the self power generator 200. A detailed configuration of the relay unit 100 and technical features of the method for preventing malfunction thereof will be described in more detail with reference to the accompanying drawings.

FIG. 2 is a block diagram specifically showing the relay unit and the self power generator shown in FIG. 1.

First, as shown in FIG. 2, the self power generator 200 includes a source power receiver 210, a rectifying switching circuit 220, a voltage converter 230, and a DC converter 240.

The source power receiver 210 receives three phases system powers of the power transmission and distribution line or the power system as the source power and transmits the powers to the rectifying switching circuit 220. To this end, the source power receiver 210 detects current and voltage of the power transmission and distribution line or the power system using a plurality of first current transformers CT1 and first voltage transformers. In this connection, the source power receiver 210 may transmit the three phases system currents of the three phases system powers to the rectifying switching circuit 220 via the plurality of the first current transformers CT1.

The rectifying switching circuit 220 rectifies three phases system voltages and currents of the three phases system powers using rectifying circuitry including a switching circuit and a bridge circuit. Then, the rectified three phases system voltages and currents may be transmitted to the voltage converter 230.

The voltage converter 230 converts the rectified three phases system voltages to voltages having a preset constant voltage level using a constant current transformer and a constant voltage transformer and transmits the converted voltages to the DC converter 240.

The DC converter 240 converts the three phases system voltages having the constant voltage level to a DC voltage to generate the driving power of the relay, and provides the generated driving power to the relay unit 100.

At least one of the rectifying switching circuit 220, the voltage converter 230, and the DC converter 240 may include a switching circuit that cuts off the three phases system voltages or currents. Thus, the three phases system voltages or currents may be cut off according to the fail signal from the relay unit 100.

As shown in FIG. 2, the relay unit 100 includes a rated power unit 110, a self power unit 120, a relay controller 130, a circuit breaker 140, and an abnormality sensing unit 150.

Specifically, the rated power unit 110 may receive the rated power inV from the outside and convert the rated power to a driving voltage level. The rated power unit 110 is used when the driving power from the self power generator 200 is input to the relay unit 100. The rated power unit 110 is also used as an emergency power in the event of the abnormality of the three phases system currents.

The self-power unit 120 may change a voltage level of the driving power input from the self-power generator 200 to a preset level (for example, 5V or 12V, etc.) and supply the driving power having the changed level to the abnormality sensing unit 150 and the relay controller 130.

The circuit breaker 140 cuts off the system powers Va, Vb, and Vc to be transmitted to load 300 under control of the relay controller 130 when power transmission and distribution line failure or power system failure occurs.

The abnormality sensing unit 150 monitors in real time the three phases system powers used as the source power of the self power generator 200, and generates the fail signal when the system power abnormality occurs. The generated fail signal is transmitted to the relay controller 130 and the self power generator 200. To this end, the abnormality sensing unit 150 receives the three phases system powers from a source power input terminal of the self power generator 200 via the second current transformers CT2.

In this connection, the abnormality sensing unit 150 samples the current changes of the three phases system powers Va, Vb, and Vc used as the source power of the self power generator 200 at a predefined period, respectively. The abnormality sensing unit 150 of the relay unit 100 obtains differences between sampling values of three phases system currents obtained via the predefined number of samplings and monitor the changes in the three phases system currents in real time, based on the obtained differences. Then, the abnormality sensing unit 150 of the relay unit 100 may detect the presence or absence of the abnormality of the three phases system currents in real time. Thus, when the occurrence of the abnormality of the three phases system currents is detected, the abnormality sensing unit 150 of the relay unit 100 may generate the fail signal.

The abnormality sensing unit 150 must identify the presence or absence of abnormality of the source power of the self power generator 200 in real time even when the driving power is blocked. Thus, the abnormality sensing unit 150 may receive power from a separate external power supply or an emergency battery as driving power thereof.

The relay controller 130 may be configured to include an intelligent electronic device equipped with a micro processing unit such as MCU or CPU. The relay controller 130 measures the system power amount of the power transmission and distribution line or the power system in real time and control the cut off operation of the circuit breaker 140 when the failure occurs.

Further, the relay controller 130 stops the relaying operation of the relay unit 100 and the driving power generation operation of the self power generator 200 when the fail signal as generated from the abnormality sensing unit 150 is input thereto.

In one example, the relay unit 100 may further include the external power receiver 110 which receives the rated power from the outside and changes a voltage level of the input rated power to a preset level (for example, 5V or 12V, etc.) and supplies the power having the preset level to the abnormality sensing unit 150 and the relay controller 130 as driving power thereof.

Thus, the relay controller 130 identifies in real time whether the driving power from the external power supply is below a preset reference voltage or a reference current amount. The relay controller 130 identifies in real time whether the external power as supplied is at a level sufficient to allow the relay unit to operate in a stable manner. When abnormality occurs in the external power, the relay controller 130 may generate a further fail signal. Thus, the relay controller 130 may determine whether to activate the cut-off operation of the circuit breaker 140 based on the further fail signal and the fail signal input from the abnormality sensing unit 150.

In other words, the relay controller 130 may operate using the driving power of the self power generator 200 when only the further fail signal is generated. When the fail signal is generated from the abnormality sensing unit 150 but the further fail signal is not generated, the relay controller 130 may operate using the power input via the external power receiver 110.

When the fail signal is generated from the abnormality sensing unit 150 and the further fail signal is generated, the relay controller 130 may stop both the relaying operation of the relay unit and the driving power generation operation of the self power generator 200. Thereafter, in order to reactivate the relaying operation of the relay unit 100 and the driving power generation operation of the self power generator 200, the fail signal must be deactivated under a stricter condition.

FIG. 3 is a block diagram specifically showing the abnormality sensing unit shown in FIG. 2.

The abnormality sensing unit 150 shown in FIG. 3 includes a detector 151, a monitoring unit 152, condition storage 153, and a fail generation unit 154.

Specifically, the detector 151 detects three phases system currents and voltages of the system power used as the source power using at least one of a current transformer and a voltage transformer. In this connection, the detector 151 receives three phases system powers Va, Vb, and Vc from a source power input terminal of the self power generator 200 via the second current transformers CT2. Then, the three phases system powers Va, Vb, and Vc are transmitted to the monitoring unit 152.

The monitoring unit 152 samples the current change of each of the three phases system powers Va, Vb and Vc at a preset period. The monitoring unit 152 obtains differences between sampling values of three phases system currents obtained via the predefined number of samplings and monitor the changes in the three phases system currents in real time, based on the obtained differences.

In this connection, the condition storage 153 stores therein the plurality of abnormality occurrence conditions predefined by the operator. The storage may support the monitoring unit 152 to monitor the differences between the sampling values of three phases system currents under the abnormality occurrence conditions.

Accordingly, the monitoring unit 152 obtains differences between sampling values of three phases system currents obtained via the predefined number of samplings and then compares the differences with each other under the abnormality occurrence conditions and then determines the presence or absence of the system power abnormality based on the comparison result. The more detailed description thereof is as follows.

FIG. 4 is waveform diagrams showing signals corresponding to sampled system power changes as detected by the abnormality sensing unit of FIG. 3.

First, as shown by a waveform A in FIG. 4, the monitoring unit 152 samples the current change of each of the three phases system powers Va, Vb and Vc at a predefined period, and obtains differences between sampling values of three phases system currents obtained via the predefined number of samplings and monitor the changes in the three phases system currents in real time, based on the obtained differences.

Specifically, in this connection, the monitoring unit 152 samples the current change in each of the three phases system powers Va, Vb, and Vc based on an interrupt counter signal according to a preset frequency (for example, 60 Hz frequency), and acquires sampling data at a preset period (e.g. 5 cycles).

Subsequently, the monitoring unit 152 stores the acquired sampling data at a preset period (for example, 1 cycle (16.67 ms corresponding to 60 Hz) in a separate wave buffer. After the sampling is completed, the monitoring unit 152 may execute an algorithm such as Fourier Transform to analyze the current changes.

In order for the monitoring unit 152 to identify the presence or absence of abnormality, the monitoring unit 152 obtains differences between sampling values of three phases system currents obtained via the predefined number of samplings and then compares the differences with each other and then determines the presence or absence of the system power abnormality based on the comparison result.

In this connection, the comparison may be performed based on the abnormality occurrence conditions stored in the condition storage 153. In this connection, the abnormality occurrence conditions may include at least one of a condition in which the sampling values of the three phases system currents are maintained at the same polarity sign for a preset duration or period, a condition where the sampling values of the three phases system currents vary at the same slope for a preset duration or period, a condition where the sampling values of the three phases system currents increase or decrease at the same rate for a preset duration or period, and a condition where the sampling values of the three phases system currents are kept at the same value for a preset duration or period.

When it is determined based on these conditions that a state in which all of the sampling values of the three phases system currents are concurrently above a certain value (for example, 2.5 A) lasts for a preset duration or period, the monitoring unit may check a polarity sign thereof.

In this connection, as shown by a C waveform in FIG. 4, when a state in which all of the sampling values of the three phases system currents are concurrently maintained at the same polarity sign (positive or negative polarity sign) lasts for a preset duration or period (e.g., 4 sampling cycles), the abnormality may be detected. In this connection, an abnormality occurrence counter may be issued. When the abnormality occurrence counter has been issued times above or equal to a predetermined number of times (for example, three times), it may be determined that the abnormality has occurred and thus the fail signal may be generated.

In the process in which the monitoring unit 152 obtains the differences between sampling values of three phases system currents and then compares the differences with each other, the monitoring unit 152 may analyze a noise added state in which noise is added to the three phases system currents.

As shown by a B waveform in FIG. 4, the noise is added thereto. In this case, the phases of the sampling values of the phase system currents are unchanged, but only magnitudes of the changes in the sampling values may vary. Accordingly, the monitoring unit 152 may remove the noise when the noise occurs in the three phases system currents. Thus, the monitoring unit 152 may determine presence or absence of abnormality of the three phases system currents free of the noise.

Thus, when the abnormality of the three phases system currents are detected by the monitoring unit 152, the fail generation unit 154 may generate the fail signal and send the same to the relay controller 130 and the self power generator 200.

After the relaying operation stops due to the occurrence of the fail signal, the monitoring unit 152 of the abnormality sensing unit 150 may sample the three phases system currents under a different sampling condition due to the relaying operation stop. It is desirable that a sampling condition for reactivating the relaying operation is stricter than a sampling condition for abnormality occurrence determination.

That is, the different sampling condition due to the relaying operation stop is configured to have a sampling period larger than that of the sampling condition to determine the presence or absence of abnormality of the three phases system current. Further, the number of samplings per the sampling period in the former may be larger than that in the latter.

In this way, the monitoring unit 150 may obtain differences between the sampling values of each of the three phases system currents as sampled under the stricter sampling condition and thus monitors the changes in the three phases system currents in real time based on the obtained differences. In addition, when the plurality of predefined abnormality occurrence conditions are not met, the relay unit 100 may normally activate the relaying operation thereof and the power generation operation of the self power generator 200.

FIG. 5 is a flow chart for sequentially describing a method for operating a self power relay according to an embodiment of the present disclosure.

Referring to FIG. 5, a method for operating a self power relay according to an embodiment of the present disclosure is described as follows.

First, a sampling period (e.g., 4 cycles or greater) at which the three phases system currents are sampled, the number of samplings per each sampling period, at least one abnormality occurrence condition, and a condition under which the relaying operation stop is deactivated are stored in the condition storage 153 of the abnormality sensing unit 150 (ST1).

Thereafter, the detector 151 receives the three phases system powers Va, Vb, and Vc from the source power input terminal of the self power generator 200 via the second current transformers CT2 and transmits the same to the monitoring unit 152.

Further, the monitoring unit 152 samples the changes in the currents of three phases system powers Va, Vb, and Vc based on the interrupt counter signal according to the preset frequency (for example, 60 Hz frequency) and acquires sampling data at a preset period (for example, 5 cycles) (ST2).

The monitoring unit 152 stores the acquired sampling data at a preset period (for example, 1 cycle (16.67 m corresponding to 60 Hz) in a separate wave buffer. After the sampling is completed, the monitoring unit 152 executes an algorithm such as a Fourier Transform to analyze the current changes (ST3).

In addition, when it is determined in consideration of the characteristics that the noise is added to the three phases system currents, the monitoring unit 152 may remove the noise and may identify the presence or absence of abnormality of the three phases system currents free of the noise in real time (ST4).

Subsequently, the monitoring unit 152 calculates differences between the sampling values of the three phases system currents. When it is determined based on the differences that a state in which all of the sampling values of the three phases system currents are concurrently above a certain value (for example, 2.5 A) lasts for a preset duration or period, the monitoring unit 152 checks a polarity sign thereof. In this connection, when a state in which all of the sampling values of the three phases system currents are concurrently maintained at the same polarity sign (positive or negative polarity sign) lasts for a preset duration or period (e.g., 4 sampling cycles), the monitoring unit 152 determines that the abnormality occurs (ST5). In this connection, an abnormality occurrence counter may be issued. When the abnormality occurrence counter has been issued times above or equal to a predetermined number of times (for example, three times), it may be determined that the abnormality has occurred and thus the fail signal may be generated.

When the fail signal has been issued previously (ST6), a following operation is carried out: after stopping the relaying operation thereof, the monitoring unit 152 re-samples the three phases system currents under a different sampling condition due to the relaying operation stop and re-identifies presence or absence of abnormality (ST7).

To the contrary, when the fail signal is currently issued, the monitoring unit 152 re-identifies whether the fail signal is deactivated (ST8). In this connection, the monitoring unit 152 calculates differences between the sampling values of the three phases system currents sampled under a stricter sampling condition and monitors the changes in the three phases system currents in real time, based on the calculated differences.

In addition, when the plurality of predefined abnormality occurrence conditions are not met, the relay unit 100 may normally activate the relaying operation thereof and the power generation operation of the self power generator 200.

As described above, in the self power relay and the method for preventing malfunction thereof according to the present disclosure having various technical features as described above, the power of the power transmission and distribution line or the power system power may be used as the self-driving power of the relay when performing the relaying operation. Thus, presence or absence of abnormality in the power system may be identified by monitoring in real time a state in which the source current and voltage used for generating the driving power of the relay become unstable.

Thus, when overvoltage or overcurrent occurs in the system power used as the source power, or sufficient power amount is not supplied to the relay in generating the driving power of the relay, the relay may detect this situation in real time, thereby to prevent the malfunction of the relay. In particular, according to the present disclosure, when monitoring the system power used as the source power, a software algorithm may be used to identify change in the system power amount, thereby minimizing effect of noise or erroneous samples.

Further, the change in the current amount of the system power used as the source power may be sampled at a preset period. Then, the sampled change may be analyzed based on various abnormality occurrence conditions, thereby to identify presence or absence of the abnormality. Thus, abnormality detection efficiency and stability of the relay may be further improved.

The present disclosure as described above may be subjected to various substitutions, modifications, and changes by a person having ordinary knowledge in the technical field to which the present disclosure belongs within a scope that does not depart from the technical idea of the present disclosure. Thus, the present disclosure is not limited to the above-described embodiments and the accompanying drawings.

What is claimed is:

1. A self power relay comprising:
   a self power generator for converting a system power as a source power to a driving power having a preset driving power level to generate the driving power of the self power relay; and
   a relay unit configured to:
      measure a power amount of the system power in real time while operating using the driving power; and
      in an event of failure of the system power, prevent the system power from being transmitted to a load and stop a relaying operation thereof and an operation of the self power generator while operating using an external rated power,
   wherein the relay unit is further configured to:
      upon determination based on a plurality of predefined abnormality occurrence conditions that abnormality occurs in three phases system currents used as a source power of the self power generator, generate a fail signal to stop the relaying operation thereof and the operation of the self power generator,
      after the relaying operation stops due to the fail signal, sample the three phases system currents under a sampling condition changed due to the stop of the relaying operation,
      calculate differences between sampling values of the three phases system currents as sampled under the changed sampling condition and monitor change in each of the three phases system currents in real time, based on the calculated differences, and
      when the plurality of predefined abnormality occurrence conditions are not met, normally activate the relaying operation thereof and the operation of the self power generator operation.

2. The self power relay of claim 1, wherein the relay unit is configured to:
   sample current change in each of three phases system powers used as the source power for the self power generator at a preset period; and
   calculate differences between sampling values of three phases system currents obtained via a predefined number of samplings and monitor change in each of the three phases system currents in real time, based on the calculated differences.

3. The self power relay of claim 2, wherein the plurality of predefined abnormality occurrence conditions include at least one of:
   a condition in which the sampling values of the three phases system currents are maintained at the same polarity sign for a preset duration or period;
   a condition where the sampling values of the three phases system currents vary at the same slope for a preset duration or period;
   a condition where the sampling values of the three phases system currents increase or decrease at the same rate for a preset duration or period; or
   a condition where the sampling values of the three phases system currents are kept at the same value for a preset duration or period.

4. The self power relay of claim 1, wherein the sampling condition changed due to the stop of the relaying operation is configured to have a sampling period larger than a sample period in a sample condition for determining presence or absence of the abnormality of the three phases system currents, and to have a number of samplings per a sampling period larger than a number of samplings per a sampling period in the sample condition for determining presence or absence of the abnormality.

5. The self power relay of claim 1, wherein the self power generator includes:
   a source power receiver for receiving three phases system powers of a power transmission and distribution line or a power system as the source power;
   a rectifying switching circuit for rectifying three phases system voltages and currents of the three phases system powers;
   a voltage converter for converting the rectified three phases system voltages to three phases system voltages having a preset constant voltage level; and
   a direct current (DC) converter for converting the three phases system voltages having the preset constant voltage level to a DC voltage to generate the driving power as the DC voltage and supplying the driving voltage to the relay unit.

6. The self power relay of claim 1, wherein the relay unit includes:
   a circuit breaker to cut off the system power to be transmitted to a load when a failure of a power transmission and distribution line or a power system occurs;
   an abnormality sensing unit configured to monitor in real time three phases system powers used as the source power of the self power generator and to generate a second fail signal when abnormality occurs in the three phases system powers;
   a relay controller configured to:
      measure a system power amount of the power transmission and distribution line or the power system and control a cut-off operation of the circuit breaker when a failure occurs in the power transmission and distribution line or the power system; and
      stop the relaying operation of the relay unit and the operation of the self power generator when the second fail signal is issued; and a self power unit for changing a voltage level of the driving power input from the self power generator to a preset level and supply the driving power having the preset level to the abnormality sensing unit and the relay controller.

7. The self power relay of claim 6, wherein the abnormality sensing unit includes:
a detector for detecting three phases system currents and voltage used as the source power using at least one of a current transformer or a voltage transformer;
a monitoring unit configured to:
sample change in a current of each of the three phases system powers at a preset period; and
calculate differences between sampling values of three phases system currents of the three phases system powers obtained via a predefined number of samplings and monitor changes in the three phases system currents in real time, based on the calculated differences;
condition storage for storing therein a plurality of predefined abnormality occurrence conditions, and for supporting the monitoring unit to monitor the differences between the sampling values of the three phases system currents under the abnormality occurrence conditions; and
a fail generation unit for generating a second fail signal and sending the second fail signal to the relay controller and the self power generator when the monitoring unit determines that abnormality occurs in the three phases system currents.

8. A method for preventing malfunction of a self power relay, the method comprising:
converting, by a self power generator of the self power relay, a system power as a source power to a driving power having a preset driving power level to generate the driving power of the self power relay;
measuring, by a relay unit of the self power relay, a power amount of the system power in real time while operating using the driving power;
preventing, by the relay unit, the system power from being transmitted to a load in an event of failure of the system power;
monitoring, by the relay unit, change in the source power for the self power generator in real time; and
stopping, by the relay unit, an operation of the self power generator and a relaying operation of the self power relay when abnormality occurs in the source power,
wherein stopping the operation of the self power generator further comprises:
upon determination based on a plurality of predefined abnormality occurrence conditions that abnormality occurs in three phases system currents used as a source power of the self power generator, generating, by the relay unit, a fail signal to stop the relaying operation thereof and the operation of the self power generator,
after the relaying operation stops due to the fail signal, sampling, by the relay unit, the three phases system currents under a sampling condition changed due to the stop of the relaying operation,
calculating, by the relay unit, differences between sampling values of the three phases system currents as sampled under the changed sampling condition and monitor change in each of the three phases system currents in real time, based on the calculated differences, and when the plurality of predefined abnormality occurrence conditions are not met, normally activating, by the relay unit, the relaying operation thereof and the operation of the self power generator operation.

9. The method of claim 8, wherein monitoring the change in the source power and stopping the operation of the self power generator and the relaying operation of the relay unit include:
sampling current change in each of three phases system powers used as the source power for the self power generator at a preset period; and
calculating differences between sampling values of three phases system currents obtained via a predefined number of samplings and monitoring change in each of the three phases system currents in real time, based on the calculated differences.

10. The method of claim 8, wherein converting the system power to the driving power having the preset driving power level to generate the driving power of the relay unit includes:
receiving three phases system powers of a power transmission and distribution line or a power system as the source power;
rectifying three phases system voltages and currents of the three phases system powers;
converting the rectified three phases system voltages to three phases system voltages having a preset constant voltage level; and
converting the three phases system voltages having the preset constant voltage level to a DC voltage to generate the driving power as the DC voltage and supplying the driving voltage to a relay unit.

11. The method of claim 8, wherein measuring the power amount of the system power and preventing the system power from being transmitted to the load include:
measuring a system power amount of a power transmission and distribution line or a power system and controlling a cut-off operation of a circuit breaker when a failure occurs in the power transmission and distribution line or the power system;
stopping the relaying operation of the relay unit and the operation of the self power generator when the fail signal is issued; and
changing a voltage level of the driving power input from the self power generator to a preset level and supply the driving power having the preset level to an abnormality sensing unit and a relay controller.

12. The method of claim 11, wherein monitoring the change in the source power and stopping the operation of the self power generator and the relaying operation of the relay unit include:
detecting three phases system currents and voltage used as the source power using at least one of a current transformer or a voltage transformer;
sampling change in a current of each of the three phases system powers at a preset period;
calculating differences between sampling values of three phases system currents of the three phases system powers obtained via a predefined number of samplings and monitoring changes in the three phases system currents in real time, based on the calculated differences;
storing a plurality of predefined abnormality occurrence conditions, and supporting a monitoring unit to monitor the differences between the sampling values of the three phases system currents under the abnormality occurrence conditions; and generating a second fail signal and sending the second fail signal to the relay controller and the self power generator when the monitoring unit determines that abnormality occurs in the three phases system currents.

* * * * *